United States Patent
Delfyett et al.

(10) Patent No.: US 6,801,551 B1
(45) Date of Patent: *Oct. 5, 2004

(54) PROGRAMMABLE MULTIWAVELENGTH MODELOCKED LASER

(75) Inventors: Peter Delfyett, Geneva, FL (US); Eric Park, Winter Springs, FL (US); Trino Croeze, Santa Cruz (AW)

(73) Assignee: University of Central Florida, Orlando, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 10/132,820

(22) Filed: Apr. 25, 2002

Related U.S. Application Data

(60) Continuation-in-part of application No. 09/904,680, filed on Jul. 13, 2001, and a continuation-in-part of application No. 09/829,759, filed on Apr. 10, 2001, which is a division of application No. 09/344,422, filed on Jun. 25, 1999, now Pat. No. 6,314,115, which is a division of application No. 09/096,271, filed on Jun. 11, 1998, now Pat. No. 6,256,328.
(60) Provisional application No. 60/329,989, filed on Oct. 17, 2001, and provisional application No. 60/085,566, filed on May 15, 1998.

(51) Int. Cl.[7] .......................... H01S 3/10; G02F 1/135; H04B 10/12
(52) U.S. Cl. .............................. 372/23; 372/20; 349/29; 398/201
(58) Field of Search ...................... 372/20, 23; 349/29; 398/201

(56) References Cited

U.S. PATENT DOCUMENTS

| | | | |
|---|---|---|---|
| 435,809 A | 3/1984 | Tsang | 372/49 |
| 4,446,557 A | 5/1984 | Figueroa | 372/45 |
| 4,941,735 A * | 7/1990 | Moddel et al. | 349/29 |
| 5,115,444 A | 5/1992 | Kirkby | 372/50 |
| 5,210,764 A | 5/1993 | Bucher | 372/23 |
| 5,228,050 A | 7/1993 | LaCourse | 372/50 |
| 5,276,694 A | 1/1994 | Wolf | 372/20 |
| 5,276,695 A | 1/1994 | Scheps | 372/20 |
| 5,319,655 A | 6/1994 | Thornton | 372/23 |
| 5,347,525 A | 9/1994 | Faris | 372/19 |
| 5,469,454 A | 11/1995 | Delfyett, Jr. | 372/19 |
| 5,479,422 A | 12/1995 | Fermann | 372/18 |
| 5,524,012 A | 6/1996 | Wang | 372/20 |
| 5,524,118 A | 6/1996 | Kim | 372/6 |
| 5,546,415 A | 8/1996 | Delfyett | 372/25 |
| 5,548,433 A | 8/1996 | Smith | 359/158 |

(List continued on next page.)

OTHER PUBLICATIONS

Delfyett, et al., "High–Power Ultrafast Laser Diodes" HEEE Journal of Quantum Electronics, vol. 28, No. 10, Oct. 1992.

(List continued on next page.)

*Primary Examiner*—Don Wong
*Assistant Examiner*—Cornelius H Jackson
(74) *Attorney, Agent, or Firm*—Brian S. Steinberger; Law Offices of Brian S. Steinberger P.A.

(57) ABSTRACT

A programmable multiwavelength modelocked laser system. Embodiments of the system can use a computer, gratings, optical spectrum analyzer and SLM(spatial light modulator) inside of a laser cavity to control output amplitudes and phase of each of the wavelength channels of a multiple wavelength laser system. The programmable control allows for wavelength intensity(amplitude) levels of up to approximately 16 channels to be controlled and evened out. An InGaAsP SOA based modelocked multiwavelength ring laser is stabilized using a programmable liquid crystal spatial light modulator in a feedback control loop. The system produces 16 independent modelocked RZ wavelength channels at 10 GHz with 0.44 dB flatness and 25 psec pulses.

16 Claims, 17 Drawing Sheets

U.S. PATENT DOCUMENTS

| | | | |
|---|---|---|---|
| 5,555,121 A | 9/1996 | Dupont | 359/180 |
| 5,561,676 A | 10/1996 | Goldberg | 372/18 |
| 5,590,142 A | 12/1996 | Shan | 372/18 |
| 5,652,763 A | 7/1997 | Delfyett, Jr. | 372/107 |
| 5,682,262 A * | 10/1997 | Wefers et al. | 359/305 |
| 5,708,672 A | 1/1998 | Pessot | 372/23 |
| 5,719,650 A * | 2/1998 | Wefers et al. | 3498/74 |
| 5,802,086 A | 9/1998 | Hargis | 372/22 |
| 5,805,623 A | 9/1998 | Utano | 372/23 |
| 5,978,114 A | 11/1999 | Clark | 359/115 |
| 5,996,020 A | 11/1999 | Reed | 709/238 |
| 5,999,293 A | 12/1999 | Manning | 359/139 |
| 6,018,536 A | 1/2000 | Alphonse | 372/23 |
| 6,034,380 A | 3/2000 | Alphonse | 257/94 |
| 6,061,369 A | 5/2000 | Conradi | 372/6 |
| 6,064,081 A | 5/2000 | Ackerman | 372/32 |
| 6,081,631 A | 6/2000 | Brindel | 385/1 |
| 6,097,487 A | 8/2000 | Kringlebotn et al. | 356/345 |
| 6,097,743 A | 8/2000 | Alphonse | 372/32 |
| 6,192,058 B1 | 2/2001 | Abeles | 372/6 |
| 6,256,328 B1 | 7/2001 | Delfyett et al. | 372/23 |
| 6,275,317 B1 * | 8/2001 | Doerr et al. | 398/201 |
| 6,434,175 B1 * | 8/2002 | Zah | 372/20 |
| 6,577,429 B1 * | 6/2003 | Kurtz et al. | 359/279 |
| 6,594,090 B2 * | 7/2003 | Kruschwitz et al. | 359/707 |

OTHER PUBLICATIONS

Fermann, "Environmentally stable Kerr–type mode–locked erbium fiber laser producing 360–fs pulses" Optics Letters, vol. 19, No. 1, Jan. 1994.

T. Morioka, et al., "Multi–WDM–Channel, Gbit/s Pulse Generation from a Single Laser Source Utilizing LD–Pumped Supercontinuum in Optical Fibers," Photon. Tech. Lettl., vol. 6, No. 4, pp. 365–368, 1994.

T. Morioka, "Multi–WDM–Channel, Gbit/s Pulse Generation from a Single Laser Source Utilizing LD–Pumped Supercontinuum in Optical Fibers", vol. 6, IEEE Photonics, Mar. 1994.

Zhu, Dual–Wavelength Picosecond Optical Pulse Generation Using an Actively Mode–Locked Multichannel Grating Cavity Laser, vol. 6, IEEE Photonics, Mar. 1994.

Hong, "Subpicosecond Pulse Amplification in Semiconductor Laser Amplifies; Theorgy and Experiment" vol. 30, No. 4, IEEE Journal, Apr. 1994.

C. L. Wang, et al., "Dual–Wavelength Actively Modelocked Laser–Diode Array with an Grating–Loaded Cavity," Optics Letters, vol. 19, pp. 1456–1458, 1994.

M. C. Nuss, et al., "Dense WDM with Femtosecond Laser Pulse" IEEE/LEOS 1994 Annual Meeting, Boston, MA 1994.

Lenz, "All–Solid–State Femtosecond Source at 1.55m" vol. 20, No. 11, Optics Letters, Jun. 1995.

Mellish, "Diode–Pumped CR: LiSAF All–In–One Dispersion–Compensating Saturable Absorber Mirror for Compact Femtosecond Laser Sources", vol. 21, No. 7, Optics Letters, Dec. 1996.

Kopf, All–In–One Dispersion–Compensating Saturable absorber Mirror for Compact Femtosecond Laser Sources, vol. 21, No. 24, Optical Letters, Jul. 1997.

Tamura, "Dispersion–Tuned Harmonically Mode–Locked Fiber Ring Laser for Self–Synchronization to an External Clock" vol. 21, No. 24, Optical Letters, Dec. 1996.

Read, "Low–Threshold Operation of an Ultrashort–Pulse Mode–Locked Ti:Sapphire Laser" vol. 21, No. 7, Optical Letter, Apr. 1996.

Zhang, Self–Starting Mode–Locked Femtosecond Forsterite Laser with a Semiconductor Saturable–Absorber Mirror, vol. 22, No. 13, Optics Letters, Jul. 1997.

Jung, "Self–Starting 6.5–fs Pulse from a Ti:sapphire Laser" vol. 22, No. 13, Optics Letters, Jul. 1997.

Xu, "Ultrabroadband Ring Oscillator for Sub–10–fs Pulse Generation" vol. 21, No. 16, Aug. 1996.

Hong, "Femtosecond Self–and Cross–Phase Modulation in Semiconductor Laser Amplifiers" vol. 2, No. 3, IEEE Journal, Sep. 1996.

Aus der Au, "60–fs Pulses from a Diode–Pumped ND: Glass Laser" vol. 22, No. 5, Optics Letters, Mar. 1997.

Hankla, "Tunable Short–Pulse Beat–Wave Laser Source Operating at 1m" vol. 22, No. 22 Optics Letters, Nov. 1997.

Shi, "Multiwavelength 10 GH Picosecond Pulse Generation from a Single–Stripe Semiconductor Traveling Wave Amplified Using Active Mode Locking in an External Cavity" OSA/IEEE–LEOS Spring Tropical Meeting (Ultrafst Electronics and Optoelectronics, UMB4, Lake Taho, NV, 1997.

Shi, "4 x2.5–Gbit/s WDM–TDM Laser Source Based on Mode–Locked Semiconductor Lasers" vol. 3075, SPIE, Apr. 1997.

Gee, et al. "Intracavity Gain and Absorption Dynamics of Hybrid Modelocked Semiconductor Lasers using Multiple–Quanturn–Well Saturable Absorbers Appl. Phys. Letters" vol. 17, No. 18, pp. 2569–2571, Nov. 3, 1997.

Sorokina, "14–fs Pulse Generation in Kerr–Lens Mode–Locked Prismless Cr:LiSGaF and Cr:LiSAF Lasers: Observation of Pulse Self–Frequency Shift" vol. 22, No. 22, Optics Letters, Nov. 1997.

Hong, "Subpicosecond Pulse Amplification in Semiconductor Laser Amplifies: Theorgy and Experiment" vol. 30, No. 4, IEEE Journal, Apr. 1994.

Shi, et al., "20 Gbit/s Optical WDM Transmitter Using Single–Strip Multiwavelength Modelocked Semiconductor Laser" Electronics Letters, vol. 34, No. 2, pp. 179–180, Jan. 22, 1998.

P. J. Delfyett, et al. "Intercavity Spectral Shaping in External Cavity Mode–Locked Semiconductor Diode Lasers" vol. 4, No. 2, IEEE Journal of Quantum Electronics, Mar./Apr. 1998.

* cited by examiner

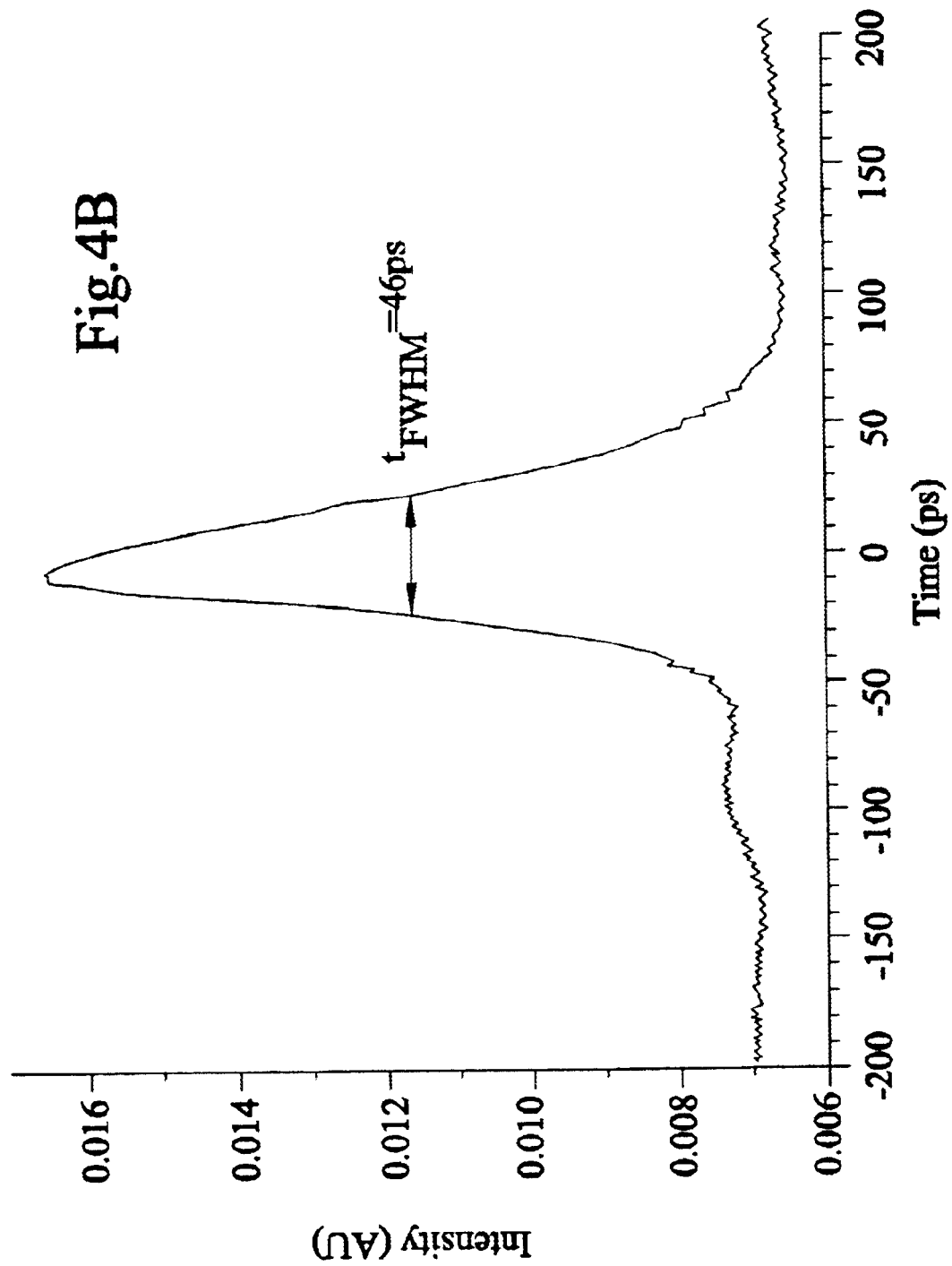

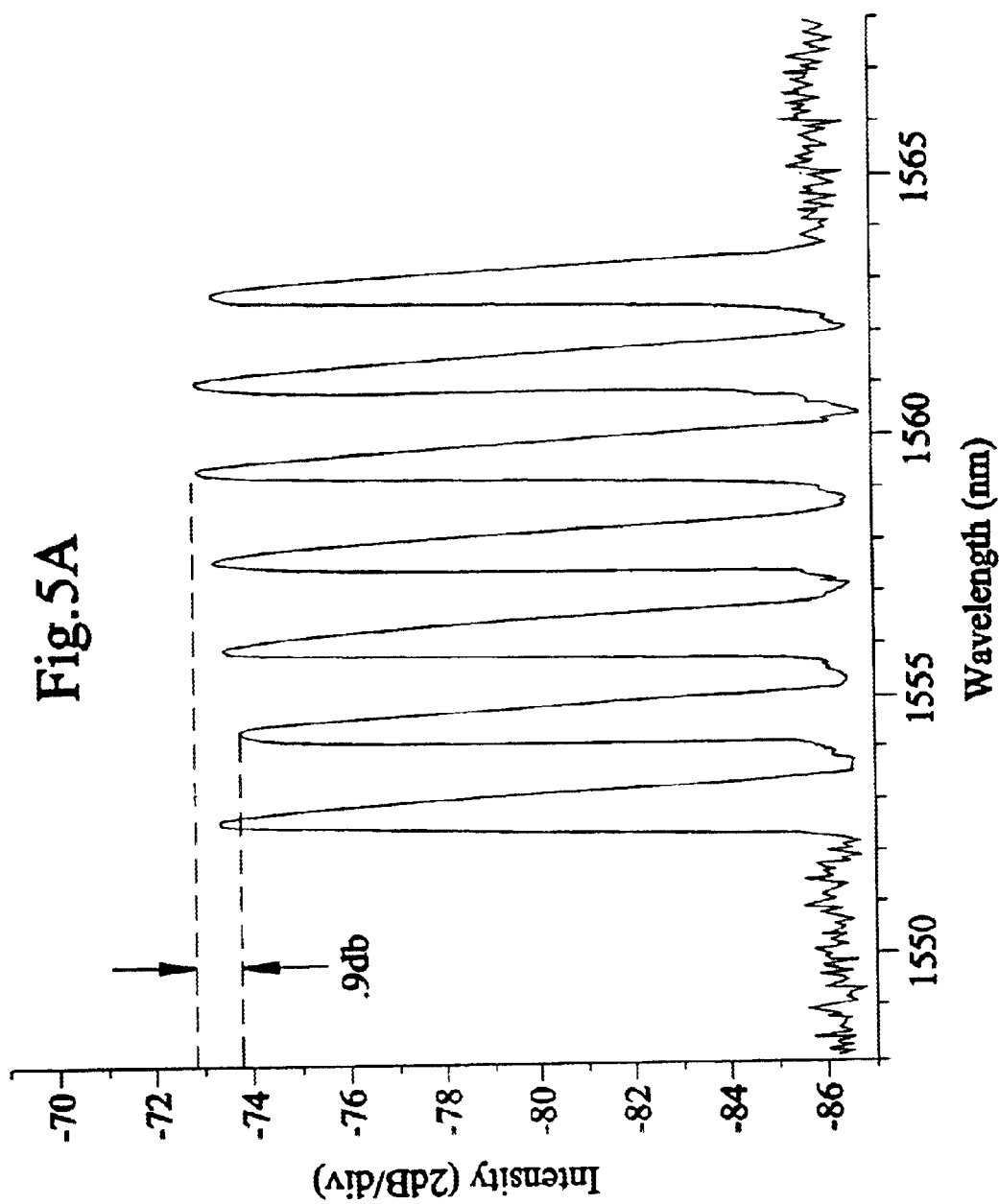

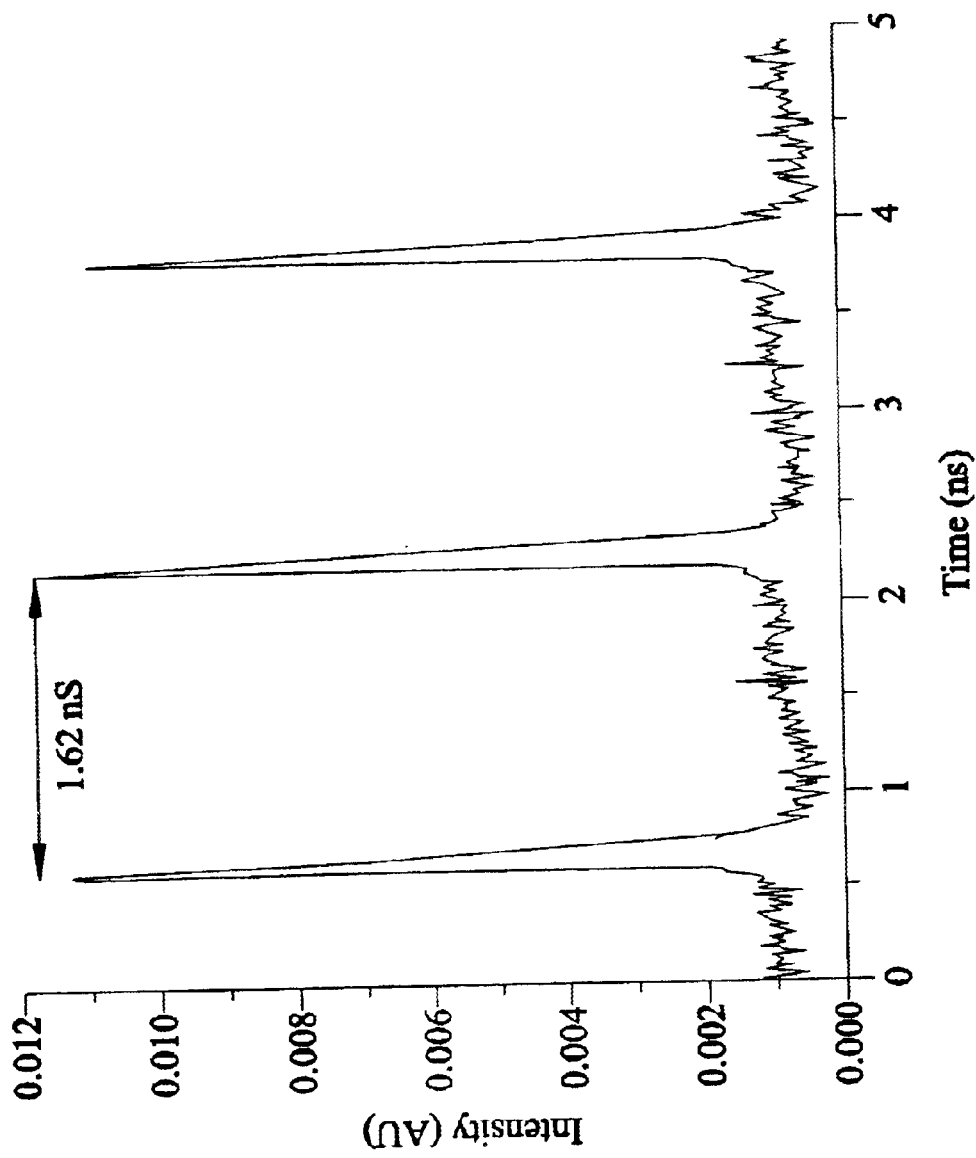

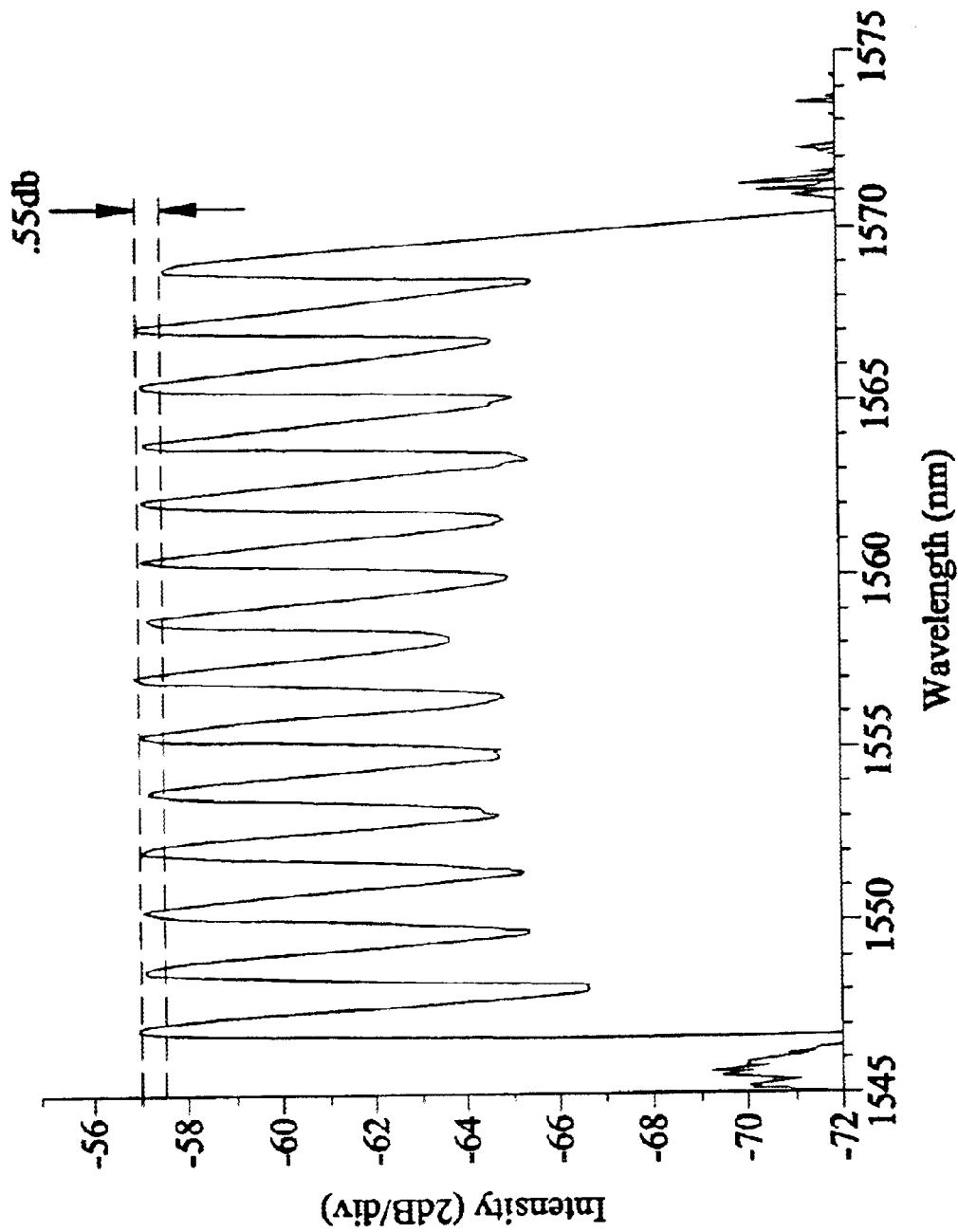

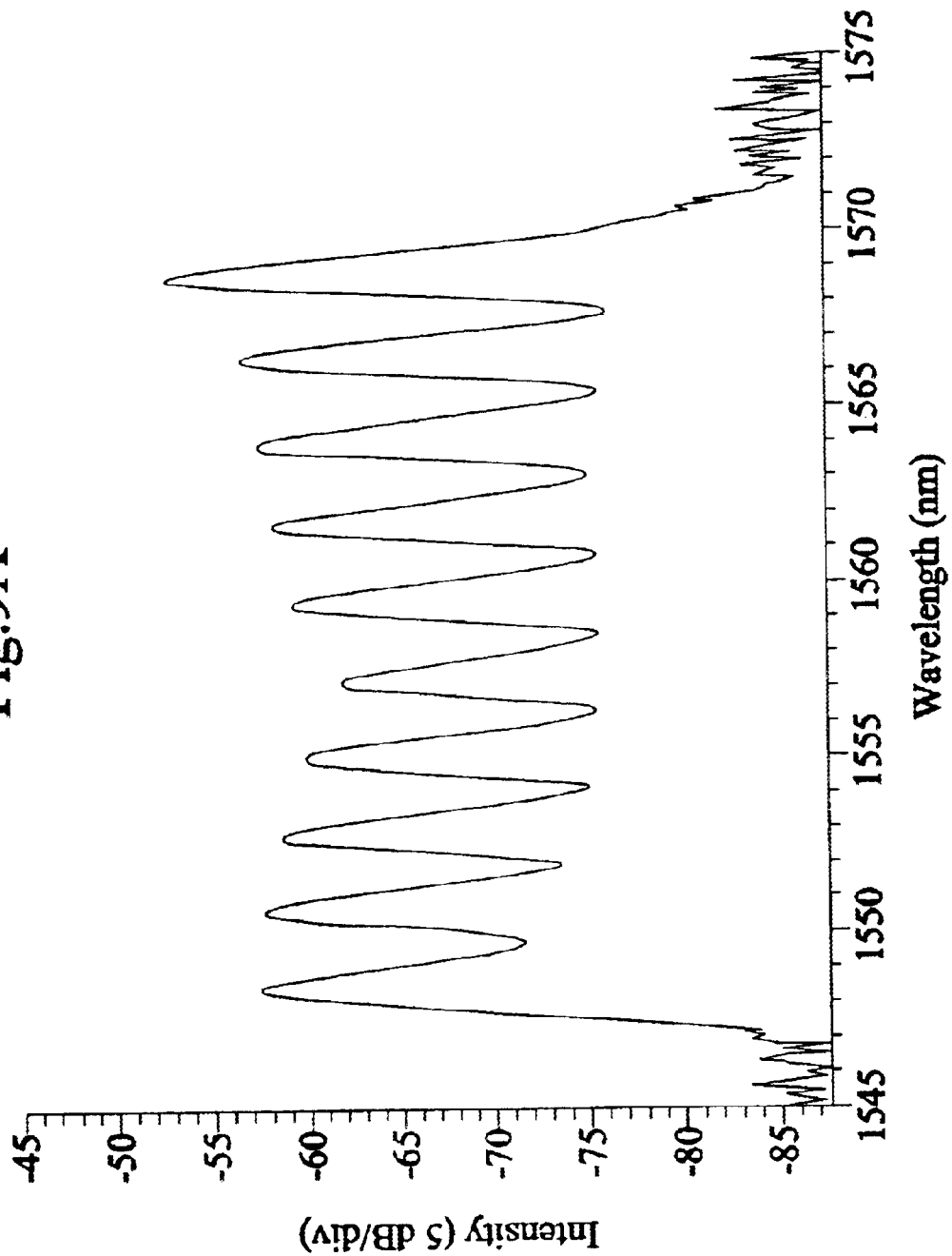

PROGRAMMABLE MULTIWAVELENGTH MODELOCKED LASER

This invention relates to lasers, and in particular to a method and apparatus for generating a multiplicity of wavelengths from a single semiconductor laser chip, that can be independently controlled in both amplitude and phase, and claims the benefit of priority to U.S. Provisional Application No. 60/329,989 filed on Oct. 17, 2001, and this invention is a Continuation-In-Part of U.S. application Ser. No. 09/904,680 filed Jul. 13, 2001, which is a divisional application of U.S. application Ser. No. 09/344,422 filed Jun. 25, 1999 now U.S. Pat. No. 6,314,115, and the invention is a Continuation-In-Part of U.S. application Ser. No. 09/829,759 filed Apr. 10, 2001, which is a divisional application of U.S. application Ser. No. 09/096,271 filed Jun. 11, 1998 now U.S. Pat. 6,256,328, which claims the benefit of priority to U.S. provisional application No. 60/085,566 filed May 15, 1998.

BACKGROUND AND PRIOR ART

Multiwavelength generation lasers have been increasingly demonstrated over the past several years. For example, the subject invention assignee as been at the forefront of developing multiwavelength modelocked semiconductor diode lasers. See for example, Shi et al. Four-wavelength, 10-GHZ pico second pulse generation from an active modelocked single-stripe diode laser, Conference proceeding presentation on May 18–23, 1997, OSA Technical Technical Digest Series Vol. 11, Conference on Lasers and Electrooptics (CLEO), 1997); and OSA Trends in Optics and Photonics, Vol. 13 of Ultrafast Electronics and Optoelectronics, Conference Proceedings of March 17–19, 1997.

Wavelength division multiplexing in telecommunication and data transmission systems increases system capacity by more fully taking advantage of the intrinsic bandwidth of installed optical fiber. Channel widths and spacings have been standardized so those necessary system components such as lasers and spectrally dispersive components can be designed for interoperability. Simultaneously, the data rate of individual channels is being pushed toward higher rates with approximately 10 Gbit standards (both Sonet and Ethernet) near deployment. Current architectures utilize a separate laser for each wavelength channel introducing complexity and cost issues. Significant research has been conducted to develop and assess potential multi-wavelength sources for WDM systems. Multiple active device arrays of both laser diodes and VCSELs have been constructed and tested but problems with growth control toward exact spectral emission remains a concern. See Kudo, K., Furushima, Y., Nakazaki, T., Yamaguchi, M., "Multiwavelength microarray semiconductor lasers", *Electron. Lett.*, v 34n 21 Oct. 15, 1998. P. 2037–2038. Continuum generation in optical fibers from high power pulsed sources followed by spectral filtering has been demonstrated but suffers from the need for the high power front end as well as the power inefficiency of discarding much of the generated spectrum in the filtering process. See Morioka, T., Mori, K., Kawanishi, S., Saruwatari, M., "Multi-WDM-channel, Gbit/s pulse generation from a single laser source utilizing LD pumped supercontinuum in optical fibers", *IEEE Photonics Tech. Lett.*, v 6 n 3 March 1994. P 365–368.

Multiple quantum well devices with individually shifted spectral gain have also been constructed and utilized downstream spectral filtering with the attendant power inefficiencies. See Coudenys, G., Moerman, I., Zhu, Y., Van Daele, P., Demeester, P., "Multiwavelength InGaAs/InGaAsP strained layer MQW laser array using shadow masked growth", *IEEE Photonics Tech. Lett.*, v 4n 6 June 1992, p 524–526. Cavities based on various grating technologies, Zhu, B., White, I., "Multiwavelength picosecond optical pulse generation using an actively modelocked multichannel grating cavity laser", *Journal of Lightwave Tech.*, v 13 n 12 December 1995, p 2327–2335, and erbium fiber ring cavities with distributed fiber gratings or etalons have also been demonstrated. See Papkyriakopoulos, T., Stavdas, A., Protonotarios, E., Avramopoulos, H., "10×10 GHz Simultaneously modelocked multiwavelength fibre ring laser", *Electron. Lett.*, 1999, 35, (2), p 179–181 and Chow, J., Town, G., Eggleton, B., Ibsen, M., Sugden, K., Bennion, I., "Multiwavelength generation in an erbium doped fiber laser using in fiber comb filters", *IEEE Photonics Tech. Lett.*, v 8n 1January 1996, p 60–62.

A common problem with current multiwavelength generation systems is that the individual channels often generate multiwavelengths having different amplitude(intensity) values.

In addition to the subject assignee's contributions, over the years various attempts have been made for generating multiwavelength lasers. See for example, U.S. Pat. No. 6,018,536 to Alphonse; U.S. Pat. No. 6,061,369 to Conradi; U.S. Pat. No. 6,064,681 to Ackerman; U.S. Pat. No. 6,192,058 to Abels; U.S. Pat. No. 6,275,511 to Pan et al. However, none of the known prior art overcomes the problems of consistently and actively preventing uneven amplitude values for each of the multiwavelength channels.

SUMMARY OF THE INVENTION

A primary objective of the subject invention is to provide a multiwavelength laser system that evens out intensity (amplitude) values of each channel.

A secondary objective of the subject invention is to provide a multiwavelength laser system that provides for computer control within the laser cavity.

A third objective of the subject invention is to provide a multiwavelength laser system having multiple wavelength channels that can be independently controlled in amplitude.

A fourth objective of the subject invention is to provide a multiwavelength laser system having multiple wavelength channels that can be independently controlled in phase.

A fifth objective of the subject invention is to provide a multiwavelength laser system having multiple wavelength channels that can be independently controlled in both amplitude and phase.

A programmable multiwavelength laser systems and methods include simultaneously generating multiwavelength channels with a modelocked diode laser and controller for automatically controlling amplitude levels of each of the channels from a Semiconductor Optical Amplifier(SOA) ring laser configuration. The system and method can include up to approximately three(3), seven(7), ten(10), twelve(12), fourteen(14) and sixteen(16) channels. The controller can be located in a closed loop inside of the laser cavity and include a computer, and a spatial light modulator(SLM) connected to gratings, wherein the computer adjusts transmission of each liquid pixel in the SLM to optimize, equalize and maximize power in each output channel, and the controller can control both phase and amplitude levels of each of the channels so that each of the channels can have substantially identical intensity levels.

Spectral flatness of multiwavelength emissions from the Semiconductor Optical Amplifier(SOA) ring laser configuration can be controlled by a programmable liquid crystal spatial light modulator(SLM) based on spectrally monitoring individual wavelength intensities of the laser output. A spectrally equal amplified output can also occur by pre-distorting the laser to account for amplifier spectral gain dependence.

Further objects and advantages of this invention will be apparent from the following detailed description of a presently preferred embodiment which is illustrated schematically in the accompanying drawings.

BRIEF DESCRIPTION OF THE FIGURES

FIGS. 4A, 4B and 4C shows a 3channel multiwavelength spectrum after activation of the programmable SLM control.

FIGS. 5A and 5B show a 7channel multiwavelength spectrum and temporal pulses spectrum using the programmable SLM control.

FIG. 7 shows a 14channel multiwavelength spectrum after activation of the programmable SLM control.

FIGS. 9A–9B shows a 10channel spectrum after activation of the programmable SLM control and the auto-gain control of FIG. 8.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

The subject invention is a Continuation-In-Part of U.S. application of U.S. application Ser. No. 09/904,680 filed Jul. 13, 2001, which is a divisional application of U.S. application Ser. No. 09/344,422 filed Jun. 25, 1999 now allowed, and the invention is a Continuation-In-Part of U.S. application Ser. No. 09/829,759 filed Apr. 10, 2001, which is a divisional application of U.S. application Ser. No. 09/096,271 filed Jun. 11, 1998 now U.S. Pat. No. 6,256,328, which is incorporated by reference.

The invention expands upon previous efforts utilizing external cavity oscillators based on SOAs at both 830 and 1550 nm. See Shi, H., Finlay, J., Alphonse, G., Connolly, J., Delfyett, P., "Multiwavelength 10-GHz picosecond pulse generation from an active modelocked single stripe diode laser", *IEEE Photonics Tech. Lett.*, v 9 n 11 November 1997, p 1439–1441; Nitta, I., Abeles, J., Delfyett, P., "Hybrid wavelength division and optical time division multiplexed multiwavelength modelocked semiconductor laser", *Applied Optics-LP*, v 39 n 36 Dec 2000, p 6799–6805; and Park, E., Abeles, J., Braun, A., Delfyett, P., "Multi-wavelength generation at 1.55 micron from an external cavity semiconductor laser", *Proceeding of SPIE*, v 4042, 2000, SPIE, Bellingham, WASH., USA, p 82–87. The intracavity inclusion of a spectral pulse shaper allows selection of the particular wavelengths allowed to oscillate while active modelocking, either gain or loss modulation, insures gain available over the whole ASE width of the SOA. Previous work used a simple spatial mask of lines and spaces to define the spectrum. In this work a liquid crystal SLM is employed to significantly increase the spectral control of the laser.

Figure 1:
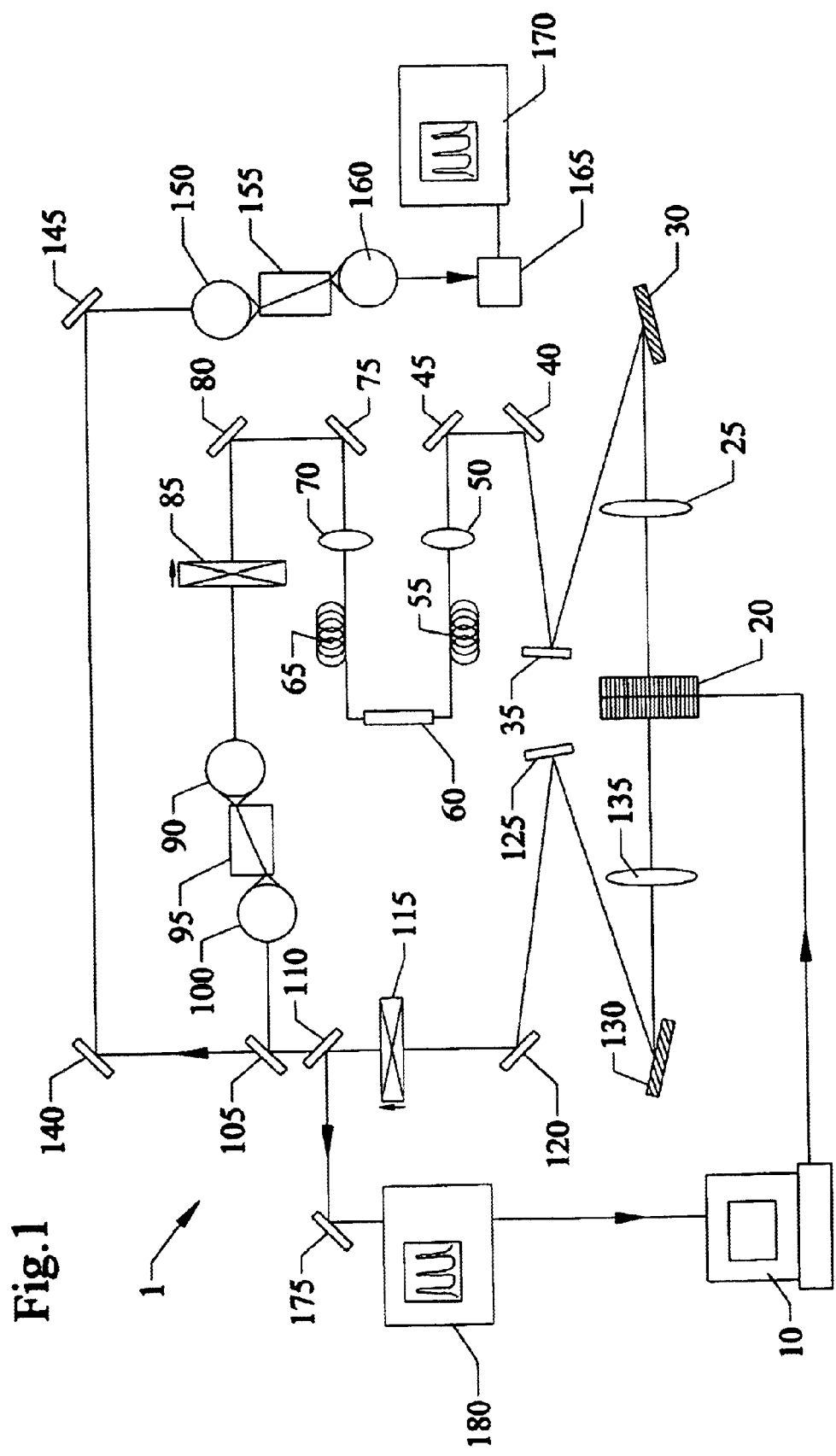
FIG. 1 is a schematic set-up of a preferred layout of a programmable multiwavelength modelocked laser.

FIG. 1 is a schematic set-up of a preferred layout of a programmable multiwavelength modelocked laser 1.

Referring to the laser configuration shown in FIG. 1, a unidirectional ring cavity is comprised of an approximately 2.3 mm MQW(multi quantum well) InGaAsP SOA (semiconductor optical amplifier) 95 with additional optics such as lens to be described, Faraday isolators 85, 115, a PM-fiber-pigtailed Mach-Zehnder intensity LiNbO3 modulator 60 and a dual grating 30, 130 4 f spectral pulse shaper intracavity with the liquid crystal SLM 20 installed in the Fourier plane. The cavity's fundamental modelocking frequency is approximately 47.784 MHz while active modelocking at either approximately 2 or approximately 10 GHz was achieved through high-speed loss modulation at the $43^{rd}$ and $211^{th}$ cavity harmonics (2.054 GHz and 10.0825 GHz respectively).

The personal computer(PC) 10 adjusts for the transmission of each liquid pixel in the SLM(spatial light modulator) 20, and optimizes, maximizes and equalizes the light power in each respective output channel. The spectral control of the cavity can be performed by the SLM 20. Dual 128 linear pixel arrays are mounted back to back to form SLM 20. The applied voltage to each pixel determines its retardance with transmissibility and phase of each pixel position being functions of the combined retardances of the two arrays. The pixel pitch is approximately 100 microns (97 microns active with a 3micron guardband). The gratings 30, 130 used can be gold-coated 900 1/mm holographics while the lenses 25, 135 can be plano-convex Pyrex singlets having a focal length f of approximately 150 mm. The result is a spectral dispersion in the Fourier plane between the lenses 25, 135 of approximately 5.6 nm/mm. The spectral control leg is installed before the loss modulator (right direction of the ring) to provide the maximum beam size on the initial grating to maintain best resolution spot size in the plane of the SLM.

A second approximately 2.3-mm SOA 155 provides single-pass amplification after which the pulsetrain is fiber coupled and either detected by a high-speed photodiode 165 for temporal pulse measurements via oscilloscope 170, or directed to an optical spectrum analyzer 180. Note that a pellicle beam splitter 110 is installed intracavity to allow spectral monitoring of the oscillator's behavior. An additional diagnostic available is a SHG(second harmonic generation) autocorrelator since the generated pulse duration is equivalent to or shorter than the impulse response of the detector 165 and sampling head of the oscilloscope 170. In FIG. 1, the SHG can be used in place of(as a substitute for) oscilloscope 170.

Referring to FIG. 1, the light path direction is shown by arrows L1 in the system 1. In the ring cavity of FIG. 1, components 125, 120 refer to reflecting mirrors used to guide light from gratings 130 into ISO 115. Reflecting mirrors 140,145 further guide light from beam splitter 105 to ball(glass) lens 150 through SOA 155 through another ball lens 160 where photo detector 165 detects the light which can then be displayed on oscilloscope 170. Other reflecting mirrors 80, 75 guide light from ISO 85 to lens 70 which focuses light into optical fiber 65 to modulator 60. After which light passes through optical fiber 55 through lens 50 which collects light and reflecting mirrors 35, 40 and 45 guide light to gratings 30 lens 25 and SLM 20.

The performance of the laser system 1 of FIG. 1 will now be described. The ASE spectrum of the diode 95 provides the baseline of spectral performance centered at approximately 1558 nm with a FWHM(full width half maxim) of approximately 30.5 nm and a typical Gaussian like profile. Threshold DC bias to the diode for CW lasing was approximately 110 mA with the LiNbO3 modulator fully transmissive (V =4.0 VDC). For modelocking, the modulator was re-biased (2.0 VDC) to a point of approximately half transmission and RF power of approximately +27 dBm was applied at the selected modelocking frequency. The laser 1 was modelocked at approximately 2 GHz with the SLM 20 adjusted to full transmissibility across all pixels producing an optical spectrum of approximately 4.5 nm FWHM and pulses of approximately 15 ps duration as measured by SHG autocorrelation. Spectral channels are then defined by setting the transmissibility of 2 adjacent pixels to maximum and the flanking pixels to minimum. This pattern is repeated for the number of desired selected channels, 12 channels initially in this case. The DC bias current to the SOA was increased to approximately 180 mA to provide higher gain across the available spectrum.

Figure 2:
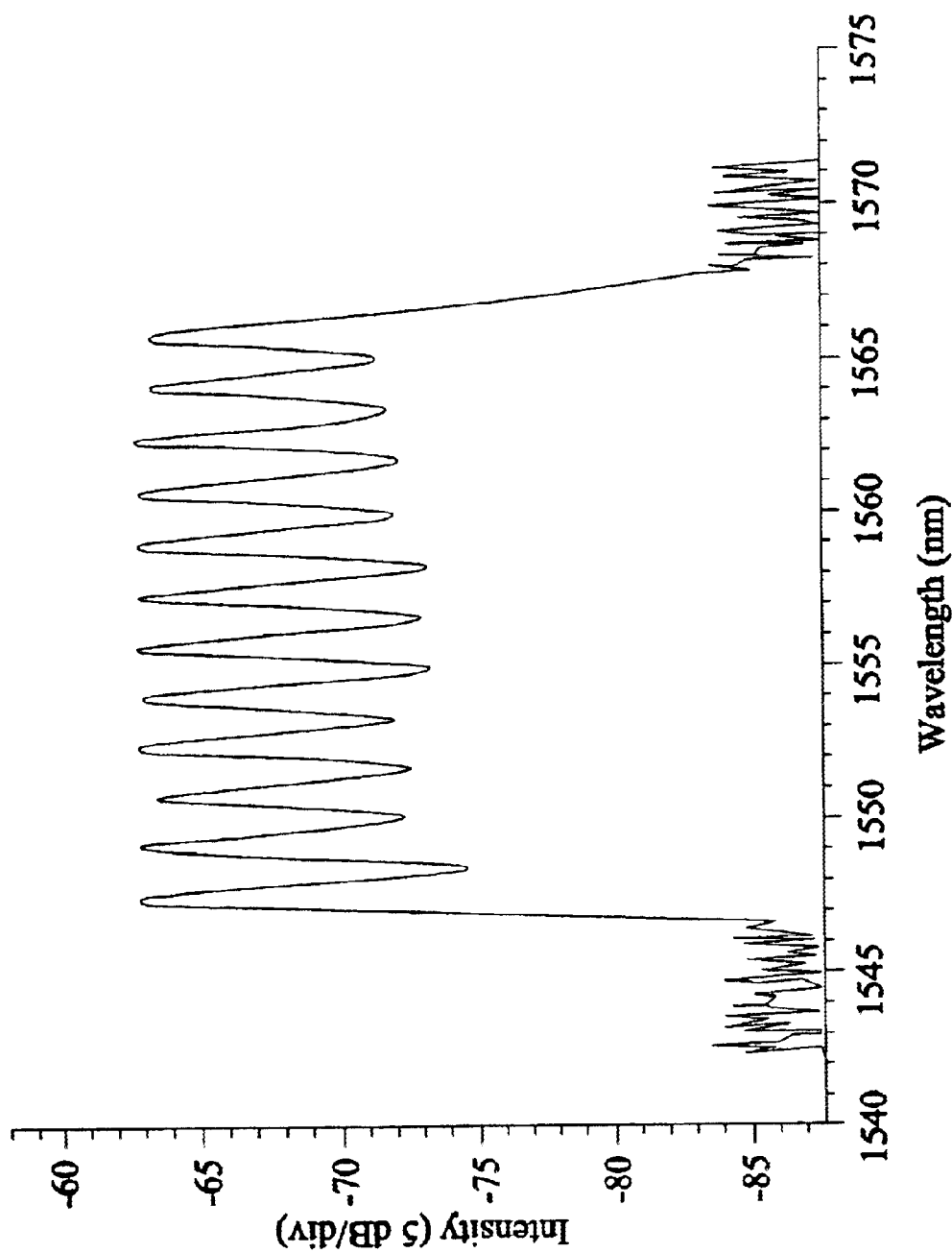
FIG. 2A shows a 12 channel multiwavelength spectrum of the multiwavelength modelocked laser with SLM modelocked at 2 GHz after a manual tuning time of approximately 2 hours.
FIG. 2B shows a 12channel multiwavelength spectrum of the multiwavelength modelocked laser after using the programmable control loop.

FIG. 2A shows a 12 channel multiwavelength spectrum of the multiwavelength modelocked laser 1 with SLM20 modelocked at 2 GHz after a manual tuning time of approximately 2 hours which occurs when the programmable control loop of the subject invention is not used.

FIG. 2B shows a 12 channel multiwavelength spectrum of the multiwavelength modelocked laser 1 after using the programmable control loop. The result is multiwavelength pulsed output with the relative amplitude of the channels reflecting the ASE gain curve of the diode as shown by the dotted curve in FIG. 2B. Time averaged power of the oscillator output was 38.9 microwatts. Note that the channels separation of approximately 212 GHz (1.68 nm) as defined by the pixel pattern corresponds with the linear dispersion calculated for the Fourier plane.

Referring to FIG. 1, the transmissibility of the pixels of channels with the greatest intensity is then progressively reduced resulting in not only lowered intensity for those channels but increased intensity of the weaker channels due to the homogeneously broadened nature of the gain medium. The process of gain flattening was initially done manually. An improvement to the laser 1 utilizes the GPIB(general purpose interface bus) bus ports of the SLM controller 20 and optical spectrum analyzer 180 in conjunction with software in the computer 10 with off-the-shelf software for controlling laboratory equipment such as but not limited to LabVIEW software by National Instruments Inc. PC 10 can be used to form a closed loop controller over the flatness of the optical spectrum peaks. The optical spectrum analyzer 180 is scanned to determine the power levels of the multiple channel peaks and an arithmetic average of the peak values calculated. The software can then determine new voltage levels to write to the SLM 20 decreasing the transmissibility of channels above the average. This process iterates until channel flatness falls within the available intensity change associated with a single bit level voltage change to the SLM 20 (approximately 10 bits over a 10VDC range). The relative amplitude of the channels after convergence is shown by the solid curve in FIG. 2B. Gain flattening does sacrifice overall output power of the oscillator. Measured output power from laser system 1 was reduced to approximately 30.25 microwatts, a loss of approximately 1.09 dB compared to the initial un-flattened output. Operating multiwavelength broadens the temporal pulses to approximately 25 ps. Note, however that the spectral width of each individual channel is approximately 0.5 nm implying a minimum pulse width of approximately 7 psec. Loop iteration time can be dominated by the settling time of the liquid crystal pixels (approximately 600 mS), the read cycle time for scanning the peaks from the optical spectrum analyzer (approximately 500 mS) and determining new voltage values for the SLM pixels based on a calibration lookup table. Convergence to steady state with amplitude variance between channels typically less than approximately 0.5 dB occurs in approximately 100 iterations or less.

Figure 3A:
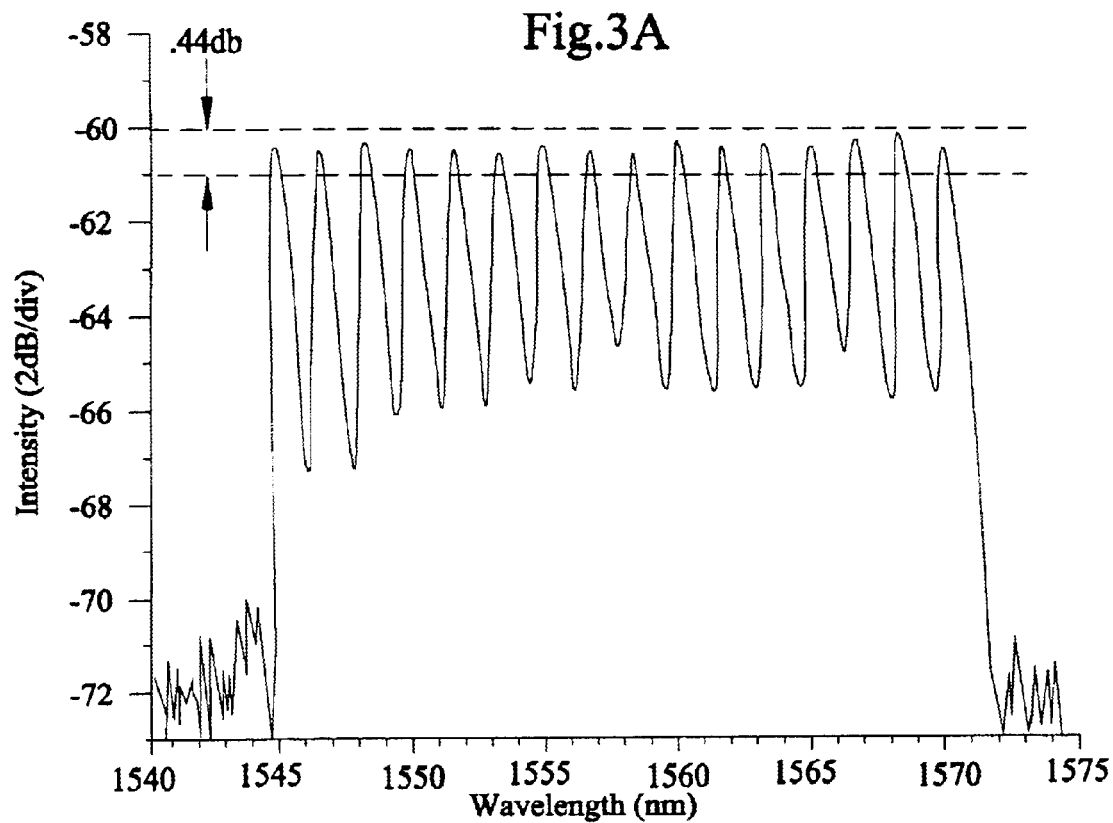
FIG. 3A shows a 16 channel multiwavelength spectrum of intensity versus wavelength after using the programmable control loop.
Figure 3B:
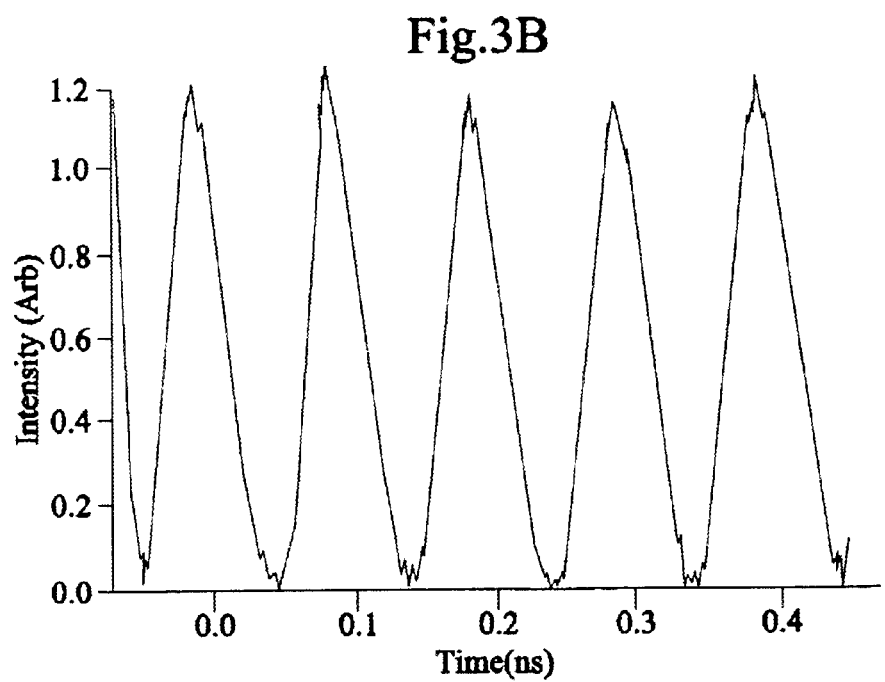
FIG. 3B shows the 16 channel multiwavelength spectrum of FIG. 3A in intensity versus time.

FIG. 3A shows a 16 channel multiwavelength spectrum of intensity versus wavelength after using the programmable control loop. FIG. 3B shows the 16 channel multiwavelength spectrum of FIG. 3A in intensity versus time. Increasing the bandwidth of the RF components employed, the laser was modulated at a nominal 10 GHz and the number of channels increased to 16 to yield a net(aggregate) bit rate for a hybrid TDM-WDM transmission system of approximately 160 Gbits/s. The optical spectrum of channels is shown in FIG. 3A as well as the pulsetrain FIG. 3B. The maximum intensity difference between channels is less than approximately 0.44 dB. Average contrast is reduced as the number of wavelengths is increased. In the 12 channel case, the contrast is approximately 10 dB whereas in the 16 channel case, this value has fallen to approximately 8 dB. Contrast can be improved for this system overall by insuring that the resolution spot size in the Fourier plane is less than or equal to the pixel size of the SLM. In this case, the resolution spot size was calculated to be approximately 1.25 times the pixel size based on available lenses and grating.

The subject invention demonstrates the ability of a single InGaAsP semiconductor optical amplifier to emit multiple wavelengths appropriate for WDM system applications when configured as a high frequency modelocked external cavity oscillator. Spectral definition and control is accomplished by a SLM in the spectrally dispersive Fourier plane of a 4f spectral pulse shaper and the spectral width available for line generation is approximately as broad as the FWHM of the spectral gain curve of the diode. Intensity flatness of the multiple spectral lines is achieved through adjusting the transmissibility of individual SLM pixels. Combining spectral monitoring of the laser output with the SLM controller in a closed loop configuration yields excellent control over the lasers spectral behavior.

Figure 4A:
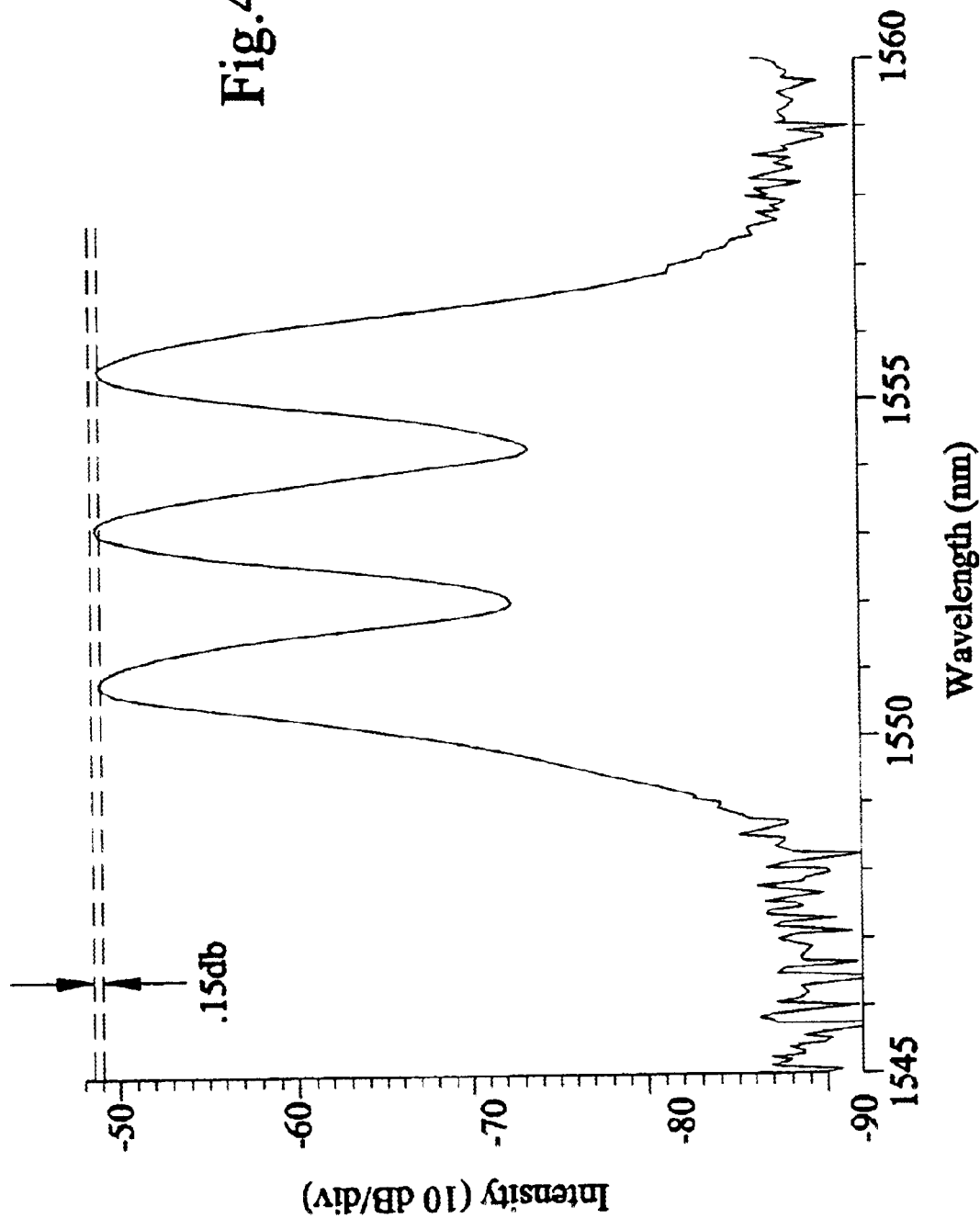
Figure 4C:
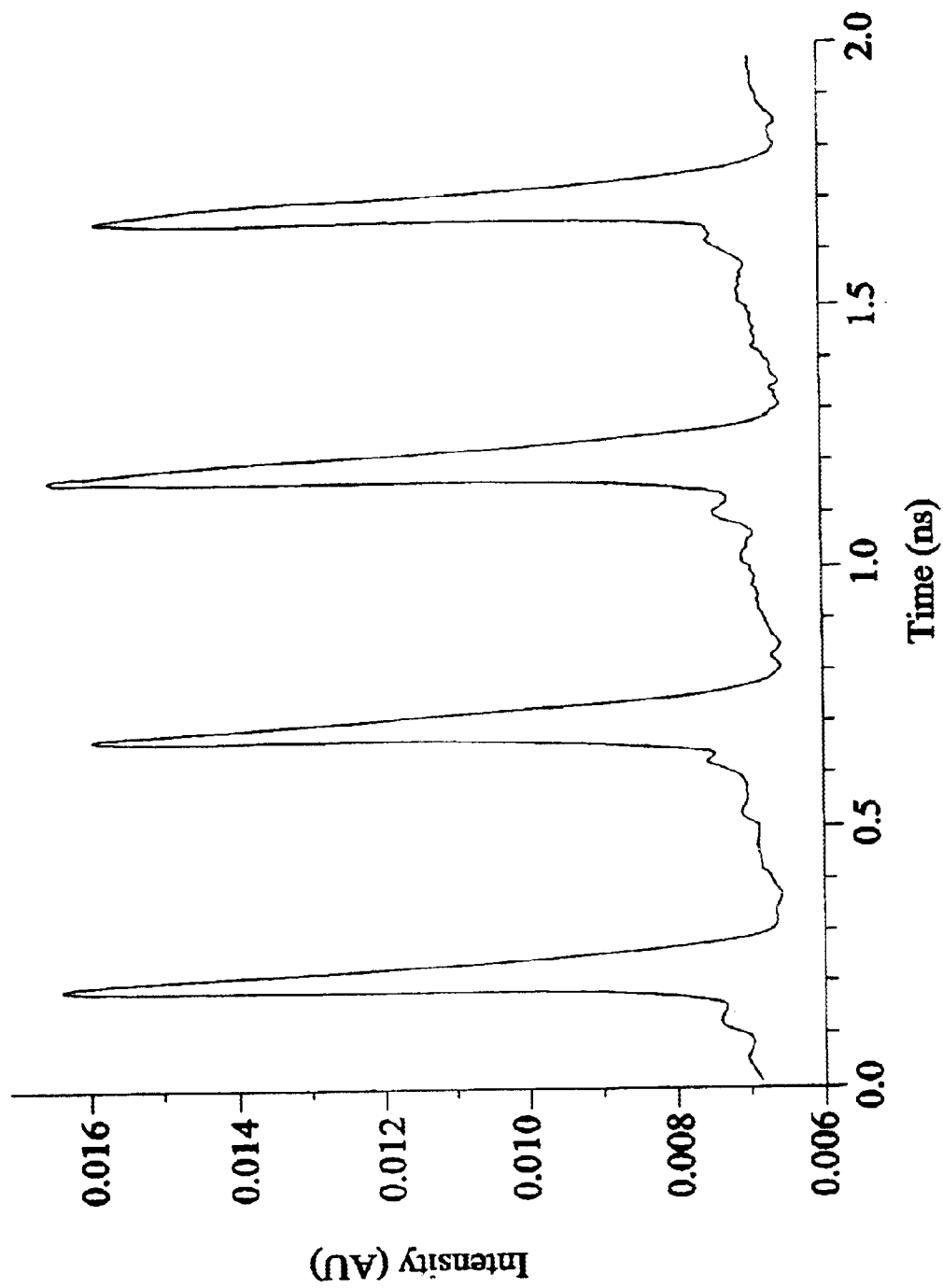

FIGS. 4A, 4B and 4C shows a 3 channel multiwavelength spectrum after activation of the programmable SLM control.

FIG. 4A shows performance of the laser system under 3 channels with SLM under a closed loop control. FIG. 4B shows a closeup of a single optical pulse duration of the 3 channel multiwavelength with SLM under a closed loop control. FIG. 4C shows a pulse train at approximately 2 GHz of the 3 channel multiwavelength with SLM under closed loop control.

FIGS. 5A and 5B show a 7 channel multiwavelength spectrum and temporal pulses spectrum using the programmable SLM control. FIG. 5A shows manual control of 7 channel multiwavelength at approximately 212 GHz which would be close to industry standards of approximately 200 GHz. FIG. 5B shows pulse train of 3 of the 7 channel multiwavelength.

Figure 6A:
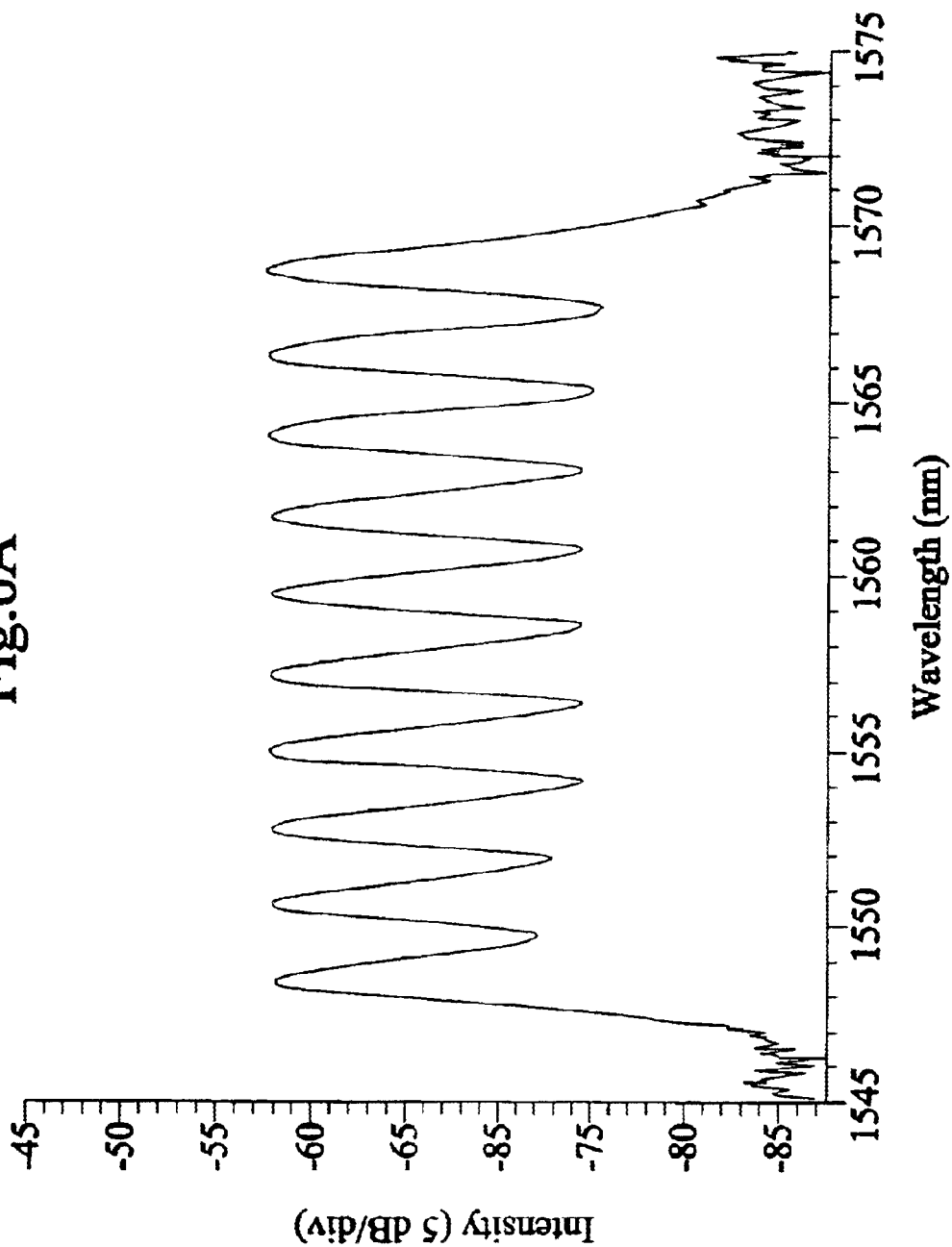
FIGS. 6A and 6B shows a 10channel multiwavelength spectrum after activation of the programmable SLM control.
Figure 6B:
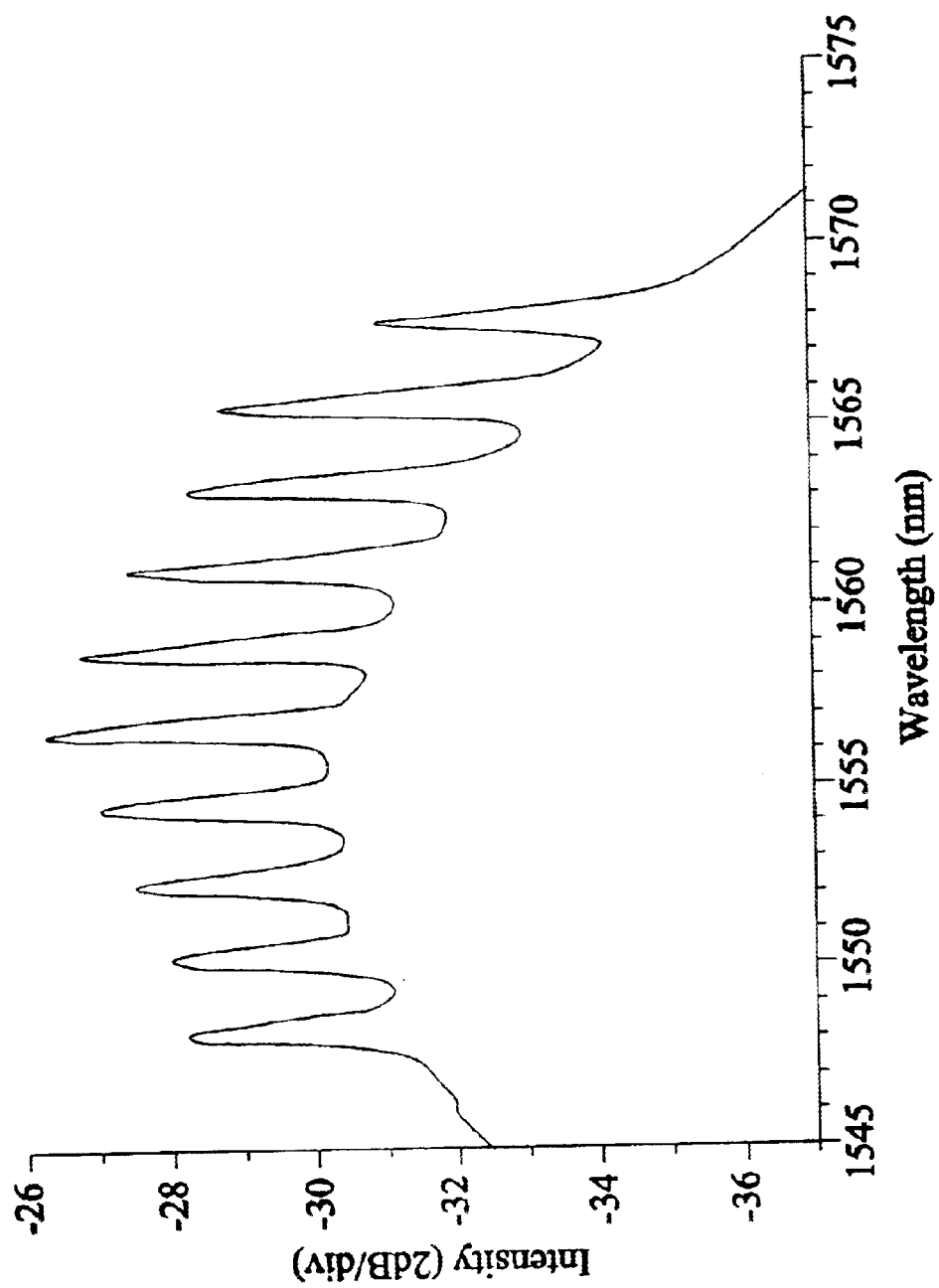

FIGS. 6A and 6B shows a 10 channel multiwavelength spectrum after activation of the programmable SLM control, where the 10 channels are operated at a modelocking rate of approximately 2 GHz. FIG. 6A shows 10 channel multiwavelength spectrum under a closed loop control. FIG. 6B shows the 10 channel multiwavelength with closed loop control after optical amplification showing distortion. As shown the closed loop spectral controller can quickly flatten relative spectral intensity of the channels of a multiwavelength laser with high precision.

FIG. 7 shows a 14 channel multiwavelength spectrum after activation of the programmable SLM control. FIG. 7 shows a pulse repetition rate of approximately 10.0825 GHz(which is less than approximately 100 picoseconds) under active closed loop control.

Figure 8:
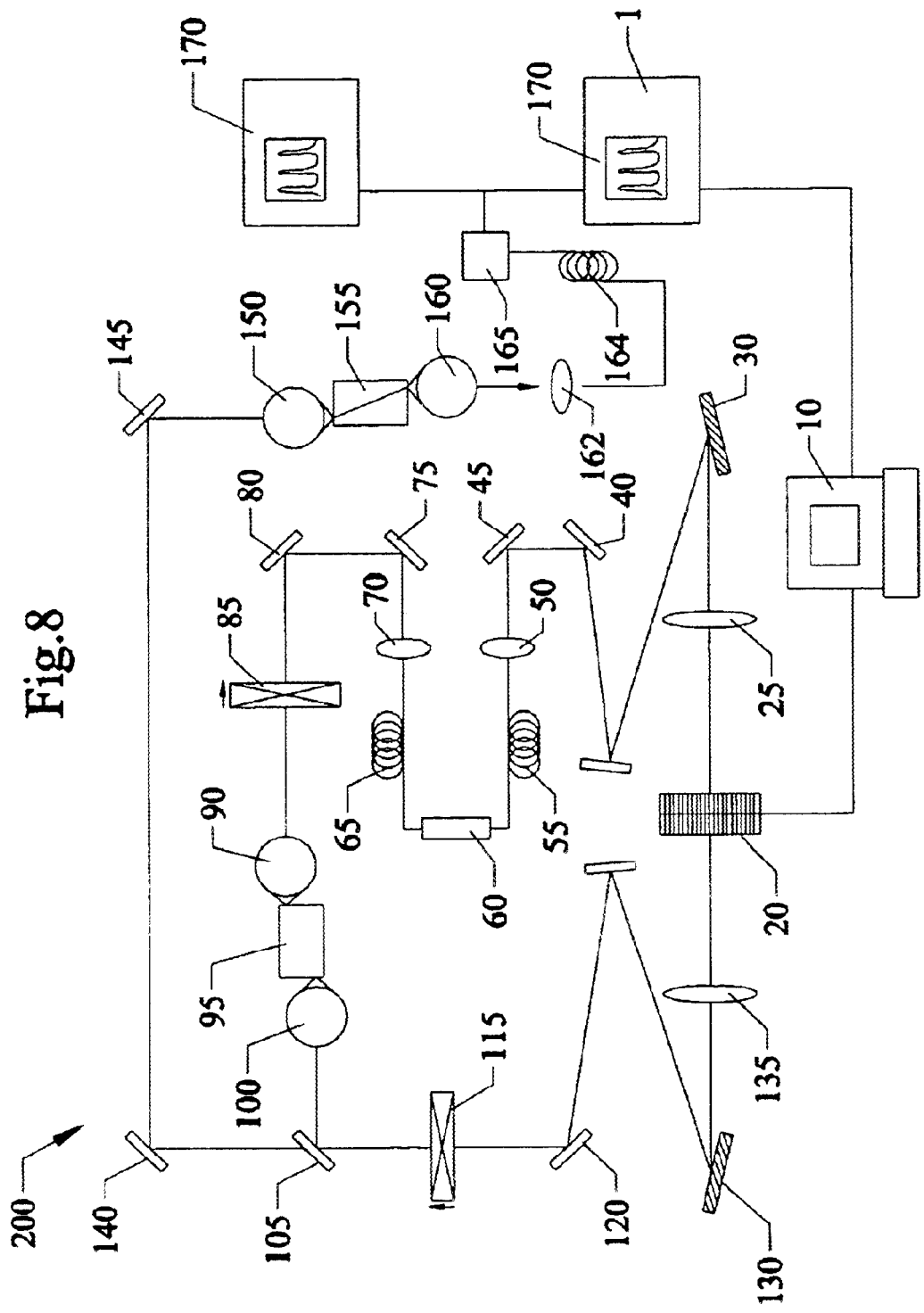
FIG. 8 is a schematic set-up of a preferred layout of a programmable multiwavelength modelocked laser of FIG. 1 using post-amplitude spectral monitoring.

FIG. 8 is a schematic set-up system 100 of a preferred layout of a programmable multiwavelength modelocked laser of FIG. 1 using post-amplitude spectral monitoring. The components of FIG. 8 are similar to those of FIG. 1 with the addition of lens 162 which collects light from ball lens 60 to focus the light onto optical fiber 163 after which beam splitter 165 separates the light to photo detector 165 and then to oscilloscope 170. Beam splitter 165 also allows for the light to pass to optical spectrum analyzer 170. In FIG. 8, the light path direction is shown by arrows L2 in the system 1. Here, PC 10 monitors light after amplification as shown by optical spectrum analyzer 170 connected to PC 10 which controls SLM 20 to predistort output at detector 165.

Figure 9B:
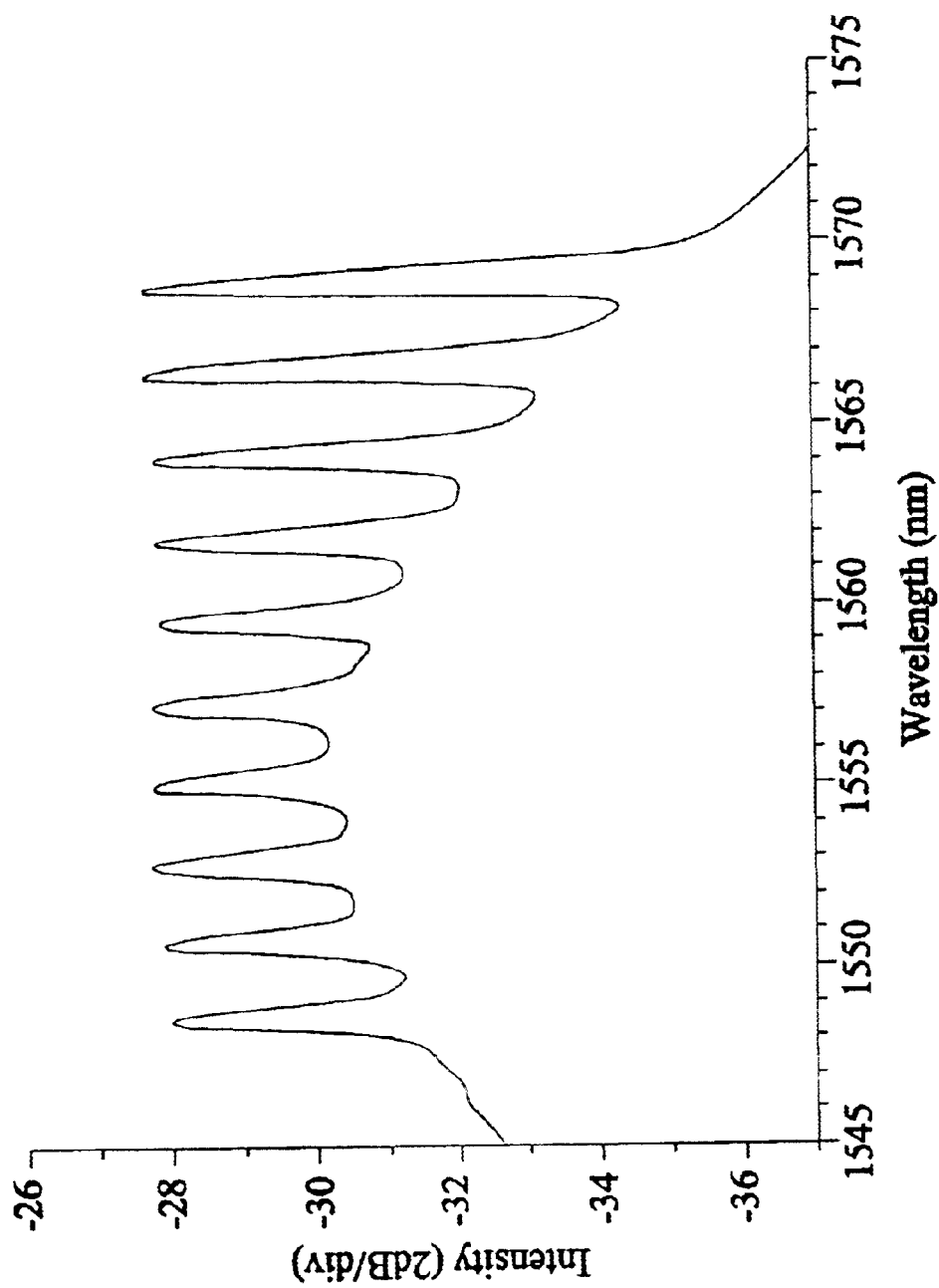

FIGS. 9A–9B shows a 10 channel spectrum after activation of the programmable SLM control and the auto-gain control of FIG. 8. FIG. 9A shows a pre-distorted optical spectrum from the laser cavity obtained from monitoring the optical spectrum after amplification. FIG. 9B is a resultant flat optical spectrum obtained by predistorting the input optical spectrum.

Figure 10:
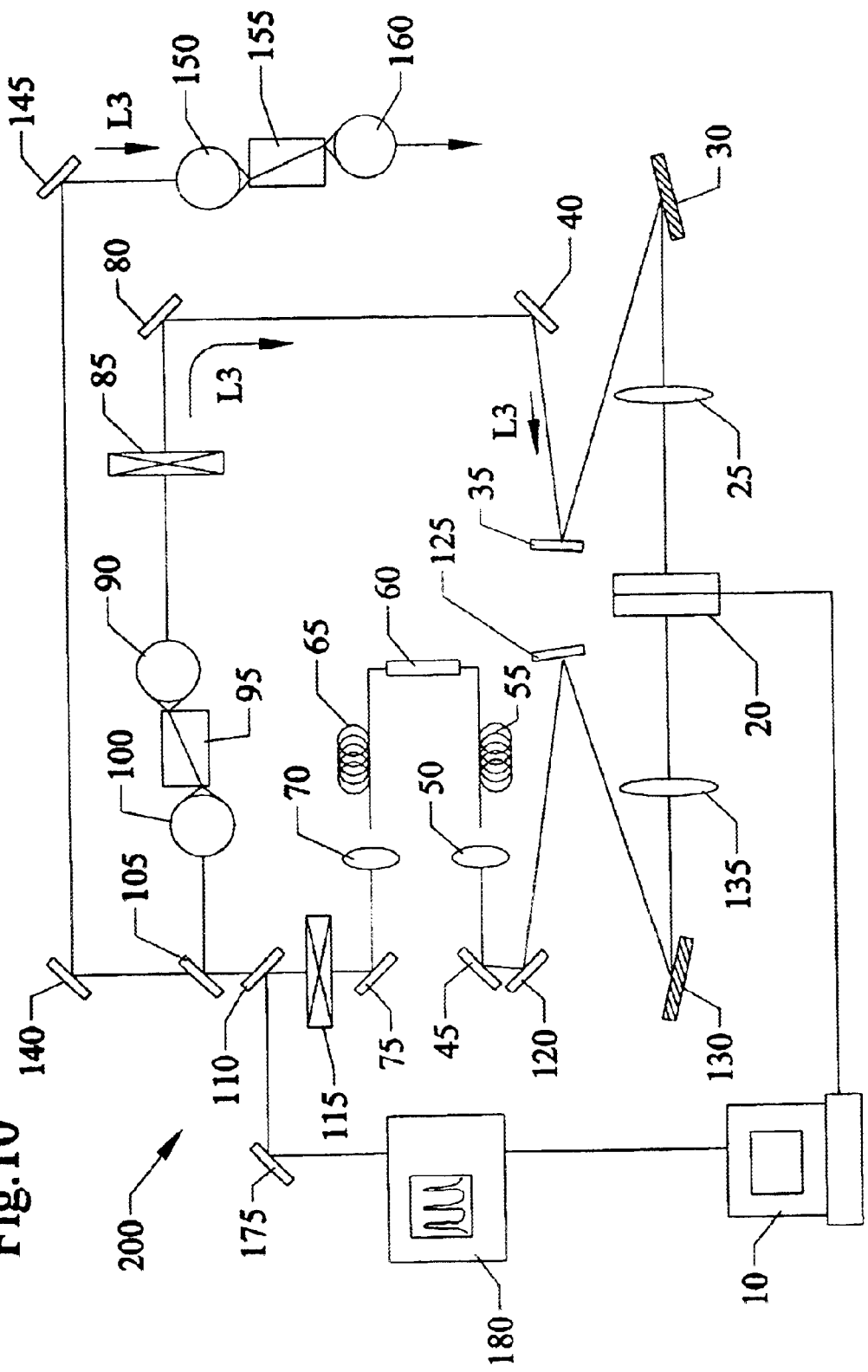
FIG. 10 is a schematic set-up of another embodiment of the programmable multiwavelength modelocked laser of FIG. 1.

FIG. 10 is a schematic set-up system 200 of another variation of the programmable multiwavelength modelocked laser of FIG. 1. Here reflector 75, lens 70, optical fiber 65, modulator 60, optical fiber 55, lens 50 and reflector 45 are located in a left leg of the cavity ring between ISO 115 and reflector 120.

Referring to FIG. 10, a multiple quantum well(MQW) InGaAsP semiconductor optical amplifier (SOA) 95 serves as the gain medium and is pumped with a DC bias current of approximately 180 mA. The laser system 200 can be configured as a ring and can include an ISO 115, 85 for unidirectional operation, an intracavity 4$f$ spectral pulse shaper to provide the spectral separation allowing multiwavelength generation, a liquid crystal spatial light modulator(SLM) 20 for definition of the wavelength channels and a Mach-Zender amplitude modulator 60 for high-frequency active modelocking. Transmissibility of the SLM 20 can be programmable to determine the relative channel amplitudes. An intracavity pellicle 110 can tap a small amount of oscillator power for coupling by way of a reflecting mirror 175 to optical spectrum analyzer 180.

Figure 11:
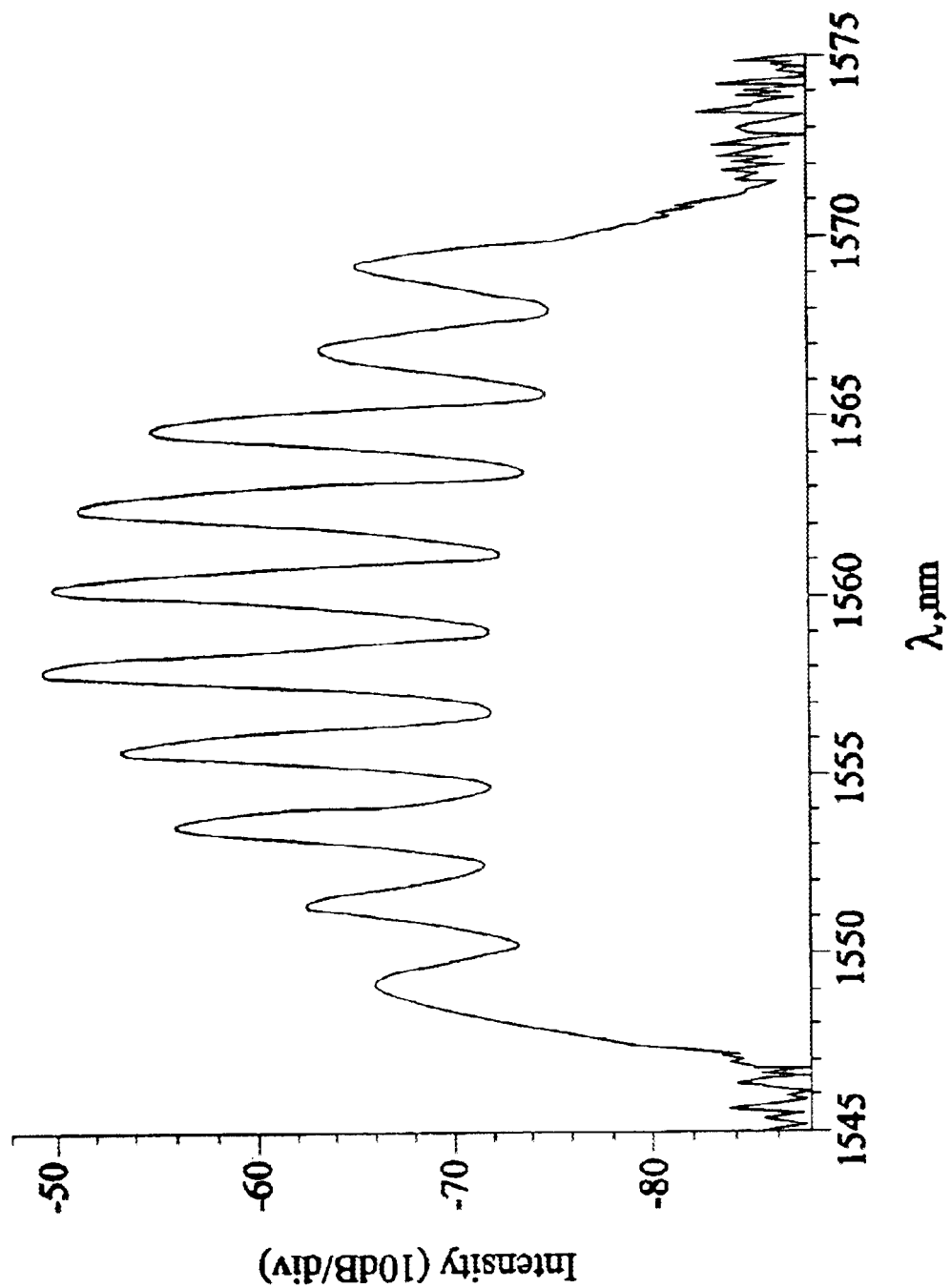
FIG. 11 shows a 10 channel spectrum of the embodiment of FIG. 10 with all channels fully transmissive.

Referring to FIG. 10, the beam size of approximately 1.25 mm, gratings 30, 130 having grating pitch of approximately 900 1/mm with grating angle of approximately 72 degrees, and focal length f of lens 25, 135 of approximately 150 mm can determine the spectral linear dispersion in the Fourier plane at the SLM 20 to be approximately 5.6 mm/mm. SLM 20 can consist of two optically aligned 128 pixel linear arrays where the pixel pitch is approximately 100 micrometers. Each pixel can be approximately 97 micrometers wide with a guard band of approximately 3 micrometers. The transmissibility of each pixel position can be determined by reference to a calibration curve of retardance against applied voltage to the pixels. An operating voltage of approximately 0 to approximately 10 VDC drive voltages to the pixels can provide approximately 10 bits of resolution. As previously discussed in reference to FIG. 1, PC 10 using software such as but not limited to LabVIEW software by National Instruments Inc., and the like, can communicate with SLM controller 20 over a GPIB bus(general purpose interface bus) to set the SLM 20 to produce various numbers of channels, for example 10 channels, with maximum transmissibility for all "on" pixels and yields the multiwavelength spectrum shown in FIG. 11. FIG. 11 shows a 10 channel spectrum of the embodiment of FIG. 10 with all channels fully transmissive.

A pattern for channel definition can be defined by the PC 10 operator by selecting the number of channels desired, number of "on" pixels and channel pitch. For example, two adjacent pixels were selected to be transmissive with the next pixel fully absorptive which can give a wavelength channel separation of approximately 1.68 nm or approximately 212 GHz, which is close to the approximately 200 GHz standard. The relative spectral intensity can reflect the spectral gain curve of the SOA with up to approximately 16 dB of intensity difference between the centre channels.

Referring to FIG. 10, the closed loop controller includes the SLM 20, OSA(optical spectrum analyzer) 180, and PC 10 which uses software such as but not limited to LabVIEW software by National Instruments Inc., and the like. PC 10 can run the loop by first reading intensity values of the OSA 180. Operators can input values of the longest wavelength spectral peak. PC 10 can poll the OSA 180 and detect intensity values for this peak and automatically detect the shorter wavelength peaks based on defined pixel spacing. Measured values can be displayed for each channel to the operator. Average intensity values can be calculated for all detected peaks and the value of each channel can be compared to the average. New voltages to be written to the SLM 20 can now be determined to flatten the relative intensity. PC 10 can calculate calibration curves of retardance measured for the SLM 20 in look up tables to determine the next voltage level to be written while the step size(approximately 1 step is equivalent to approximately 0.01 volts) can be variable. When the loop is first initiated and intensity values have a large variance, each iteration of the loop can command changes of approximately 10 steps or more(initial step size can be operator defined) while as convergence proceeds the step size can be reduced to one step/iteration for maximally flat intensity control. Loop iteration time can be governed by the settling time for the SLM 20 of approximately 600 ms, the time required to read all channel peak values from the OSA 180 of approximately 500 ms(dependent on the number of channels), and the calculation and look up table access times of the software running PC 10. For a 10 channel implementation, loop iteration time is approximately 1.5 seconds.

Figure 12:
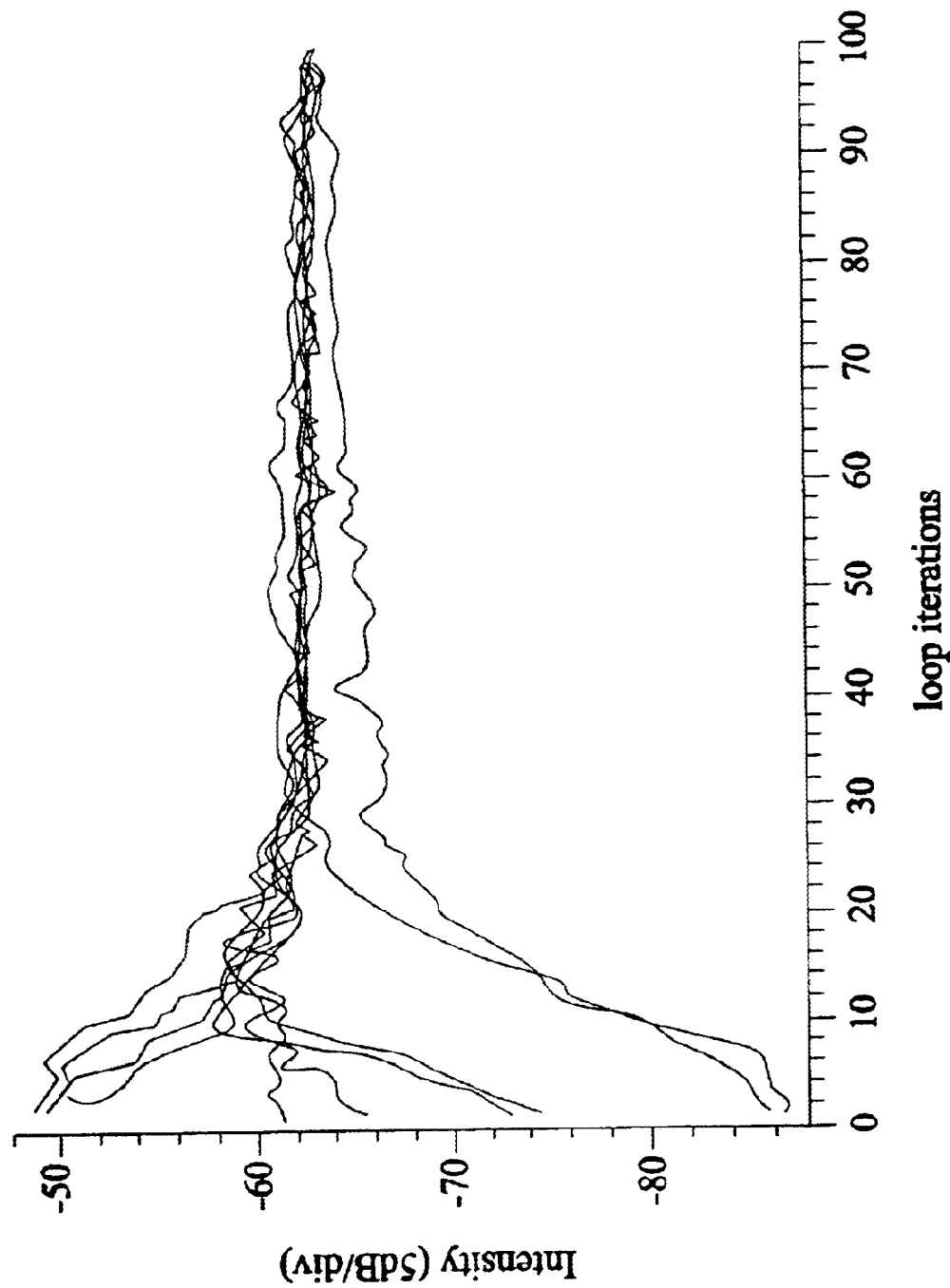
FIG. 12. shows channel intensity convergence of the embodiment of FIG. 10 under closed loop spectral control.

FIG. 12. shows channel intensity convergence of the embodiment of FIG. 10 under closed loop spectral control. FIG. 12 shows the convergence of 10 channels from the initial condition to a final flatness of less than approximately 0.5 dB. Here, the total number of iterations to reach steady state was approximately 100 or approximately 2.5 minutes. FIGS. 6A and 6B (previously described) additionally show a 10 channel multiwavelength spectrum after activation of the programmable SLM control, which are applicable to the embodiment of FIG. 10.

The invention has applications for commercial information networks, high capacity telecommunicators, fiber optic communication systems, and I.T. networks, medical imaging, and the like.

The invention can be used with other laser sources such as but not limited to Ga As, AlGaAs, and the like. Other lasers can be used such as but not limited to optical fiber lasers such as erbium, praseodymium, and the like. Solid state lasers can also be used such as but not limited to YAG, fosterite, LiSAF, and Ti:AL2O3.

Still furthermore, other semiconductor laser can be used such as but not limited to vertical cavity lasers, InP, InGaAs, InGaAsP, GaN, InGaAIN, and the like. Still furthermore other semiconductor lasers can be used such as InAlGaAs, and InAIGaP, and the like.

Still furthermore the invention can be used with other lasers such as but not limited to diode pumped lasers, gas lasers, waveguide lasers, and the like.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A programmable multiwavelength laser system, comprising:

means for simultaneously generating multiwavelength channels from an optical cavity having a laser source and a spatial light modulator(SLM) with liquid crystals; and a programmable control loop having a computer connected to the cavity through the spatial light modulator (SLM) for automatically controlling amplitude levels of each of the channels within the optical cavity, wherein the computer adjusts transmission levels of each liquid pixel in the SML to optimize power intensity levels in each output channel.

2. The programmable multiwavelength laser system of claim 1, wherein the laser source includes:

a modelocked laser source.

3. The programmable multiwavelength laser system of claim 1, wherein the laser source includes:

a diode laser source.

4. The programmable multiwavelength laser system of claim 1, further comprising:

gratings within the optical cavity connected the SLM.

5. The programmable multiwavelength laser system of claim 1, wherein the programmable control loop further includes:

means for controlling both phase and amplitude levels of each of the channels.

6. The programmable multiwavelength laser system of claim 1, wherein the optical cavity includes:

a closed loop cavity.

7. The programmable multiwavelength laser system of claim 1, wherein the laser source includes:

a semiconductor optical amplifier(SOA).

8. The programmable multiwavelength laser system of claim 1, further comprising:

an amplifier connected to an output of the optical cavity for providing single pass amplification of output signals from the optical cavity.

9. The programmable multiwavelength laser system of claim 8, wherein the amplifier includes: a semiconductor optical amplifier (SOA).

10. A programmable method for controlling intensity levels in a multiwavelength laser device, comprising the steps of:

generating simultaneously multiple wavelength channels from an optical cavity that includes a laser source and a spatial light modulator(SLM) with liquid crystals; and automatically controlling amplitude levels of each of the channels, within the optical cavity by a programmable control loop having a computer, the programmable control loop being connected to the optical cavity through the spatial light modulator(SLM), wherein the computer adjusts transmission levels of each liquid pixel in the SLM to optimize power intensity levels in each output channel.

11. The method of claim 10, wherein the step of generating further includes the step of:

modelocking the laser source.

12. The method of claim 10, wherein the step of automatically controlling includes the step of:

controlling amplitude values of the channels.

13. The method of claim 10, further comprising the step of:

providing a semiconductor optical amplifier (SOA) as the laser source.

14. The method of claim 10, further comprising the step of:

providing a laser diode as the laser source.

15. The method of claim 10, further comprising the step of:

amplifying output signals in a single pass from the optical cavity with an amplifier.

16. The method of claim 15, further comprising the step of:

providing a semiconductor optical amplifier(SOA) as the amplifier.

* * * * *